United States Patent
Kim et al.

(10) Patent No.: US 11,233,056 B2
(45) Date of Patent: Jan. 25, 2022

(54) SEMICONDUCTOR DEVICE AND METHOD FABRICATING THE SAME

(71) Applicant: XIA TAI XIN SEMICONDUCTOR (QING DAO) LTD., Qingdao (CN)

(72) Inventors: Hyunyoung Kim, Singapore (SG); Dowon Kwak, Singapore (SG); Kang-Won Seo, Singapore (SG)

(73) Assignee: XIA TAI XIN SEMICONDUCTOR (QING DAO) LTD., Qingdao (CN)

( * ) Notice: Subject to any disclaimer, the term of this patent is extended or adjusted under 35 U.S.C. 154(b) by 0 days.

(21) Appl. No.: 16/687,534

(22) Filed: Nov. 18, 2019

(65) Prior Publication Data

US 2020/0219880 A1 Jul. 9, 2020

Related U.S. Application Data

(60) Provisional application No. 62/778,959, filed on Dec. 13, 2018.

(51) Int. Cl.
| | |
|---|---|
| *H01L 27/108* | (2006.01) |
| *H01L 21/67* | (2006.01) |
| *H01L 27/105* | (2006.01) |
| *H01L 21/3105* | (2006.01) |
| *H01L 21/285* | (2006.01) |
| *H01L 21/768* | (2006.01) |
| *H01L 21/311* | (2006.01) |

(52) U.S. Cl.
CPC ...... *H01L 27/108* (2013.01); *H01L 21/28556* (2013.01); *H01L 21/31053* (2013.01); *H01L 21/31144* (2013.01); *H01L 21/67069* (2013.01); *H01L 21/67075* (2013.01); *H01L 21/76829* (2013.01); *H01L 27/1052* (2013.01)

(58) Field of Classification Search
CPC .............. H01L 27/108; H01L 27/1052; H01L 21/67069; H01L 21/31053; H01L 21/28556; H01L 21/31144
USPC ........ 257/296, 298, 303; 438/238, 239, 386, 438/399
See application file for complete search history.

(56) References Cited

U.S. PATENT DOCUMENTS

| | | | | |
|---|---|---|---|---|
| 2002/0074584 A1* | 6/2002 | Yang | ................ | H01L 21/76895 257/300 |
| 2004/0056295 A1* | 3/2004 | Agarval et al. | ... | H01L 27/10817 257/295 |
| 2010/0124821 A1* | 5/2010 | Marsh | .................... | H01L 28/65 438/674 |

* cited by examiner

*Primary Examiner* — Thinh T Nguyen
(74) *Attorney, Agent, or Firm* — ScienBiziP, P.C.

(57) ABSTRACT

A semiconductor device is provided. The semiconductor device includes a substrate, a conductive pattern, a support structure, a first conductive layer, and a dielectric layer. The conductive pattern extends vertically from the substrate. The support structure extends from an outer sidewall of the conductive pattern. The first conductive layer covers the conductive pattern. The dielectric layer at least covers the first conductive layer and the support structure.

12 Claims, 8 Drawing Sheets

SEMICONDUCTOR DEVICE AND METHOD FABRICATING THE SAME

CROSS REFERENCE TO RELATED APPLICATION(S)

The present application claims the benefit of and priority to a U.S. Provisional Application No. 62/778,959, filed on Dec. 13, 2018, the entire content of which is incorporated herein by reference.

FIELD

The present disclosure relates to semiconductor fabrication and more specifically to a capacitor having a lower electrode with a multiple-layers structure and the fabricating method thereof.

BACKGROUND

As the size of memory devices continues to become smaller, the memory capacitance is restricted due to the structure of the capacitor. In a metal-insulator-metal (MIM) structure, the limited effective area of the lower electrode leads to reduced performance of memory device.

SUMMARY

The following presents a summary of examples of the present disclosure in order to provide a basic understanding of at least some of its examples. This summary is not an extensive overview of the present disclosure. It is not intended to identify key or critical elements of the present disclosure or to delineate the scope of the present disclosure. The following summary merely presents some concepts of the present disclosure in a general form as a prelude to the more detailed description provided below.

In one example, a semiconductor device is provided. The semiconductor device includes a substrate, a conductive pattern, a support structure, a first conductive layer, and a dielectric layer. The conductive pattern extends vertically from the substrate. The support structure extends from an outer sidewall of the conductive pattern. The first conductive layer covers the conductive pattern. The dielectric layer at least covers the first conductive layer and the support structure.

In another example, a method for fabricating a semiconductor device is provided. The method includes actions of: providing a substrate having an etch stop layer formed thereon; forming a preliminary stacked structure on the etch stop layer, the preliminary stacked structure including a lower sacrifice layer contacting the etch stop layer, a support layer, and an upper sacrifice layer; forming a hole penetrating the preliminary stacked structure and the etch stop layer; forming a conductive pattern in the hole; removing the upper sacrifice layer and a portion of the support layer; removing the lower sacrifice layer; forming a first conductive layer covering the conductive pattern; and forming a dielectric layer covering the first conductive layer, a remaining portion of the support layer, and the etch stop layer.

The details of one or more examples are set forth in the accompanying drawings and description below.

BRIEF DESCRIPTION OF THE DRAWINGS

The accompanying drawings illustrate one or more implementations of the present disclosure and, together with the written description, explain the principles of the present disclosure. Wherever possible, the same reference numbers are used throughout the drawings referring to the same or like elements of an implementation.

DETAILED DESCRIPTION

Figure 1:
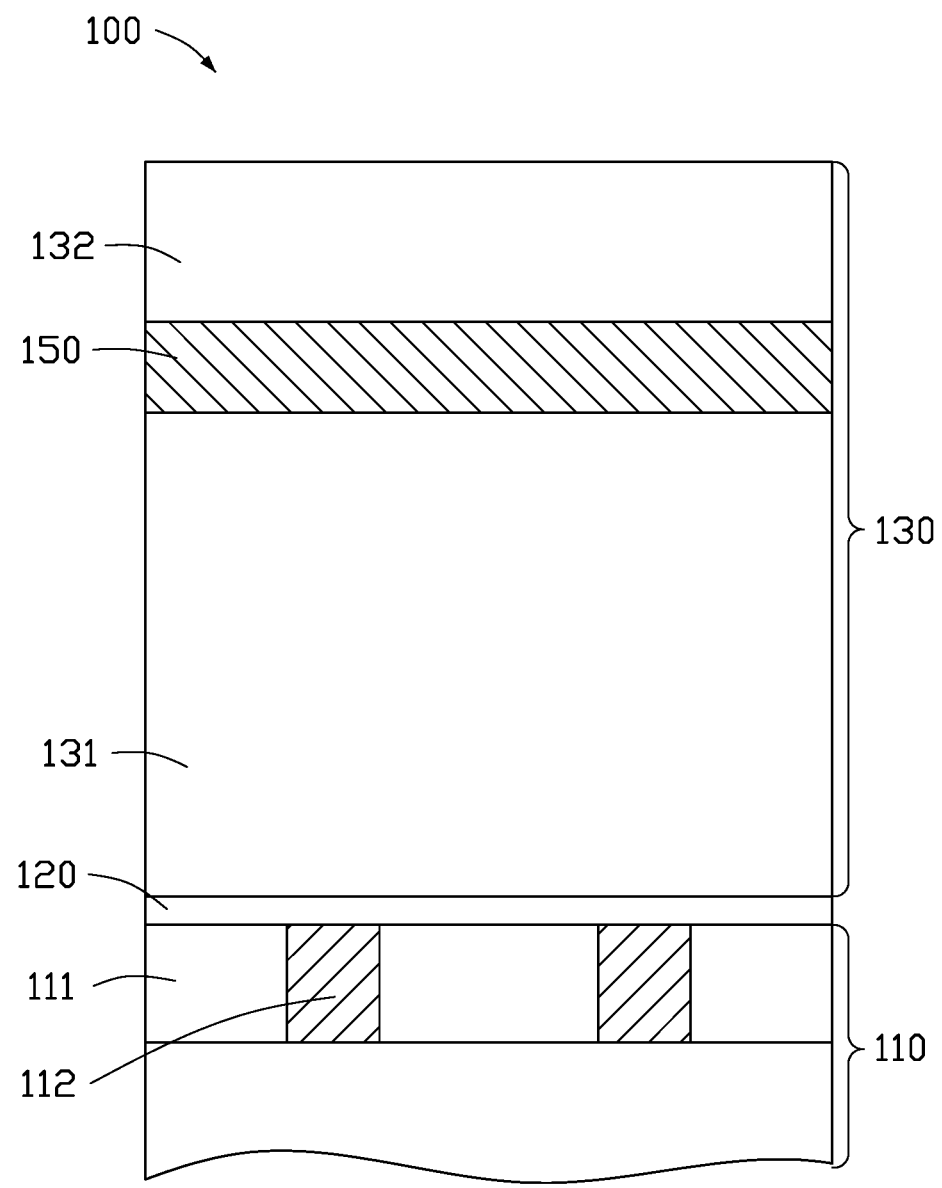
FIG. 1 is a cross-sectional view of a semiconductor device illustrating a substrate and a preliminary stacked pattern to be etched, in accordance with an implementation of the present disclosure.

To facilitate an understanding of the principles and features of the various implementations of the present disclosure, various illustrative implementations are explained below. Although example implementations of the present disclosure are explained in detail, it is to be understood that other implementations are contemplated. Accordingly, it is not intended that the present disclosure is limited in its scope to the details of construction and arrangement of components set forth in the following description or illustrated in the drawings. The present disclosure is capable of other implementations and of being practiced or carried out in various ways.

FIGS. 1 to 5 are cross-sectional views illustrating a method for fabricating a conductive pattern having a supporter in a semiconductor device 100 in accordance with various implementations of the present disclosure. As shown in FIG. 1, the semiconductor device 100 includes a substrate 110, an etch stop layer 120 formed on the substrate 110 and a preliminary stacked pattern 130 formed on the etch stop layer 120. The semiconductor device 100 may be a dynamic random access memory (DRAM) device. The substrate 110 includes a dielectric region 111 and a contact region 112. The dielectric region 111 may be formed of a dielectric material, such as silicon nitride (SiN). The contact region 112 may be formed of a metal material, such as tungsten, titanium, or tantalum. In some implementations, the substrate 110 may be a silicon wafer.

The preliminary stacked pattern 130 includes a first sacrificial layer 131, a support layer 150 formed on the first sacrificial layer 131, a second sacrificial layer 131 formed on the support layer 150, and mask patterns (not shown) formed over the second sacrificial layer 131. For example, the preliminary stacked pattern 130 may be formed by sequentially stacking layers using a deposition technique, such as ALD process, a plasma assisted atomic layer deposition (PAALD), a CVD process, a plasma enhanced chemical vapor deposition (PECVD) process, a low pressure chemical vapor deposition (LPCVD) process, a high density plasma chemical vapor deposition (HDP-CVD) process, a spin coating process, a sputtering process, or the like.

In some implementations, the etch stop layer 120 may include a material selected from SiN, silicon boron nitride (SiBN), silicon carbon nitride (SiCN), silicon carbide (SiC), silicon oxynitride (SiON), silicon oxycarbide (SiOC), or the like. The first and second sacrificial layers 131, 132 may be formed of a silicon oxide-based material, such as silicon oxide (SiOx), plasma enhanced oxide (PEOX), borosilicate glass (BSG), phosphosilicate glass (PSG), boro phospho silicate glass (BPSG), tetraethyl orthosilicate (TEOS), boro tetraethyl orthosilicate (BTEOS), phosphorous tetraethyl orthosilicate (PTEOS), or boro phospho tetraethyl orthosilicate (BPTEOS). The mask patterns may be made of a combination of SiN and polysilicon. Alternatively, the mask patterns may be made of a metal material.

Figure 2:
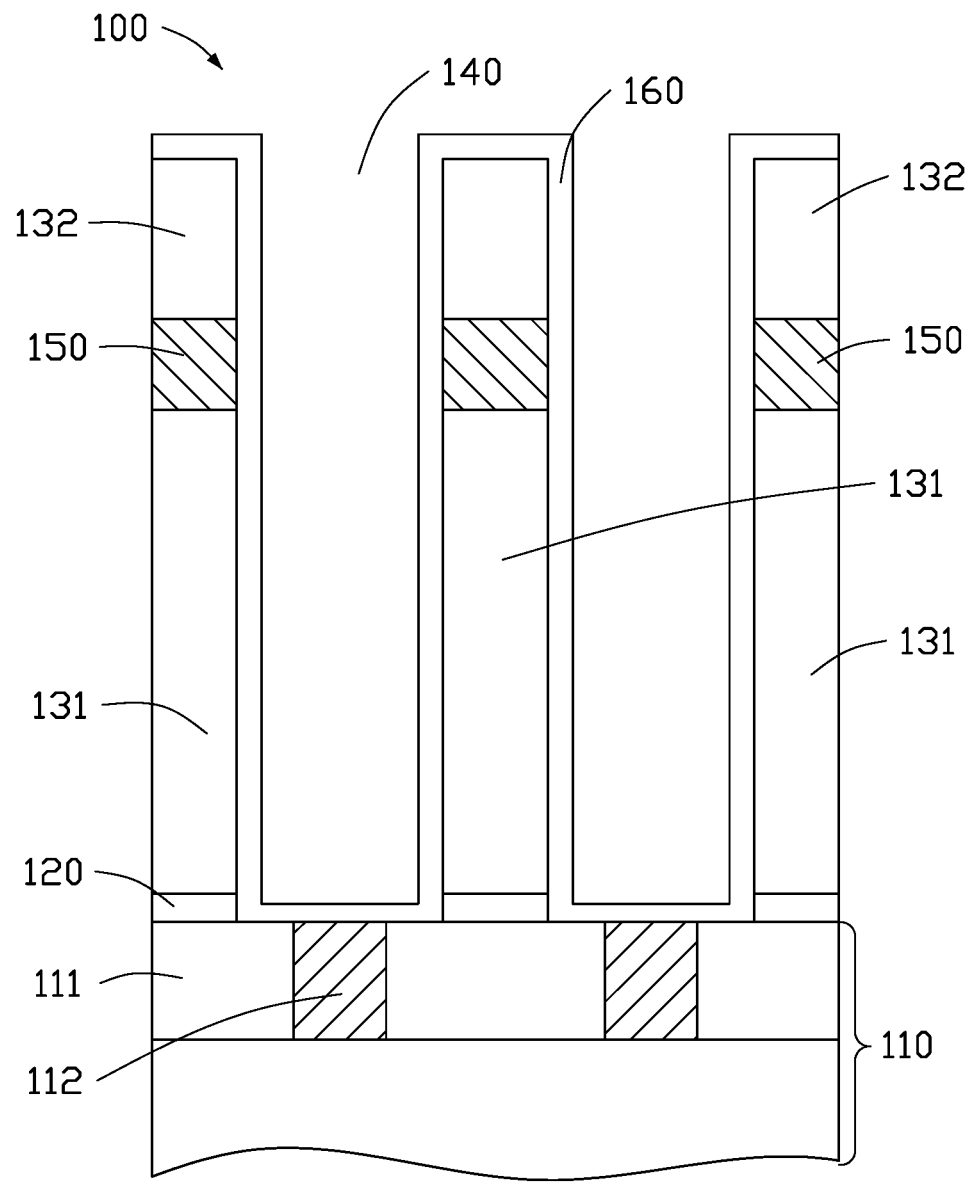
FIG. 2 is a cross-sectional view of the semiconductor device illustrating a state of forming a hole in the preliminary stacked pattern, in accordance with an implementation of the present disclosure.

As shown in FIG. 2, an etching process is performed to form a hole 140 penetrating the preliminary stacked pattern 130 and the etch stop layer 120 so that the substrate 110 is exposed. For example, a dry etching process such as a plasma etching process, an inductively coupled plasma (ICP) process, a transformer coupled plasma (TCP) process or a reactive ion etching (RIE) process may be used. Subsequently, a conductive pattern 160 is formed on the preliminary stacked pattern 130 by a deposition process such as a CVD process or ALD process. The conductive pattern 160 covers the surface of the hole 140 and the top of the preliminary stacked pattern 130. The conductive pattern 160 may be formed of a metal including a material such as titanium nitride (TiN), titanium silicide nitride (TiSiN), tungsten nitride (WN), or a compound including a material selected from the group consisting essentially of titanium (Ti), tungsten (W), oxygen (O), nitrogen (N), and silicon (Si). Preferably, the conductive pattern 160 is electrically connected to the contact region 112.

Figure 3:
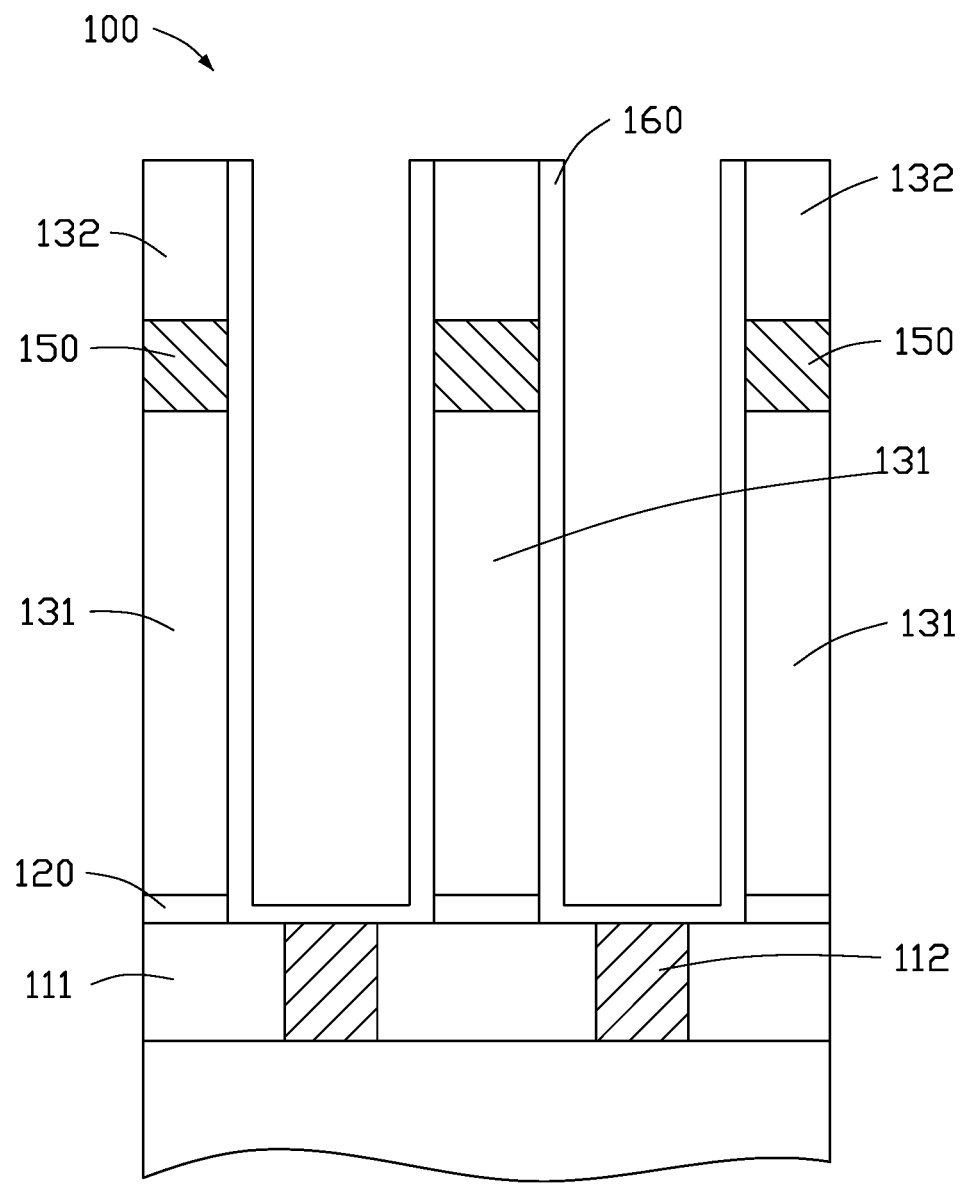
FIG. 3 is a cross-sectional view of the semiconductor device illustrating a state of removal of a conductive pattern, in accordance with an implementation of the present disclosure.
Figure 4:
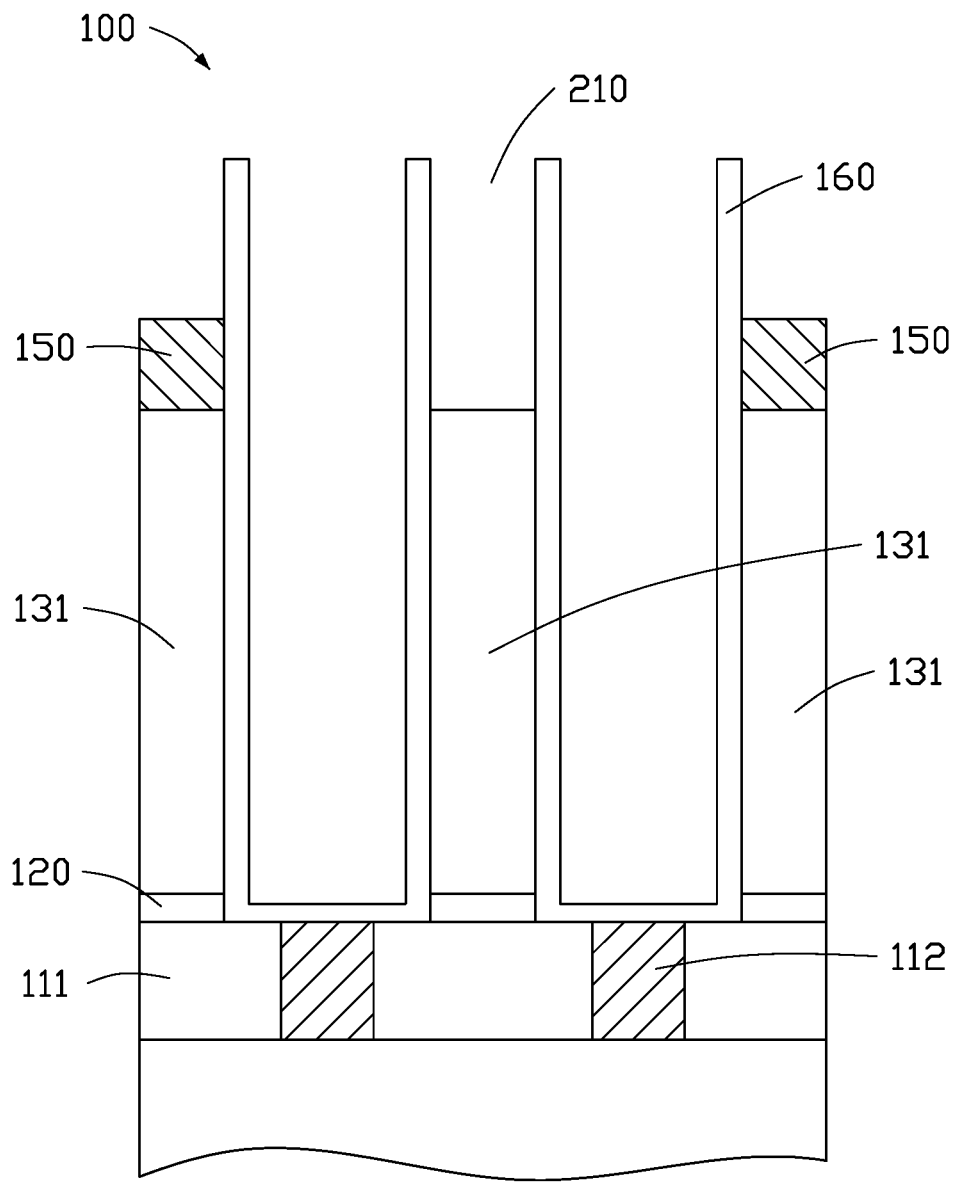
FIG. 4 is a cross-sectional view of the semiconductor device illustrating a state of removal of a second sacrificial layer, in accordance with an implementation of the present disclosure.
Figure 5:
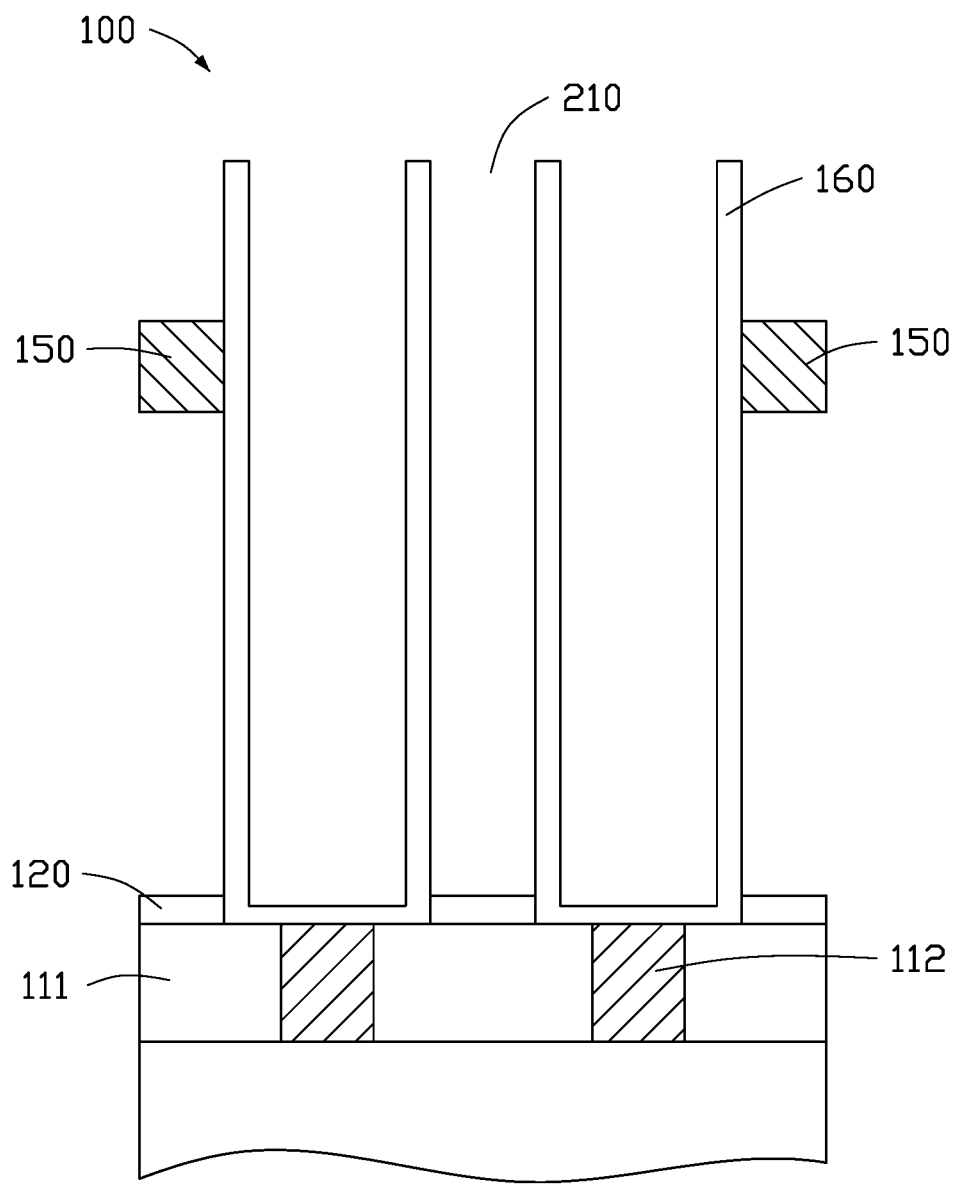
FIG. 5 is a cross-sectional view of the semiconductor device illustrating a state of removal of a first sacrificial layer, in accordance with an implementation of the present disclosure.

Referring to FIGS. 3 to 5, semiconductor fabricating processes are used to remove the first sacrificial layer 131 and the second sacrificial layer 132. As shown in FIG. 3, a portion of the conductive pattern 160 is removed by a planarization process such as a etch-back process or a chemical mechanical polishing (CMP) process. Subsequent to the removal, a top surface of the second sacrificial layer 132 is exposed. As shown in FIG. 4, a first wet etch process is used to remove the second sacrificial layer 132. Subsequently, a dry etch process is used to remove a portion of the support layer 150 so as to form a recess 210 to expose the first sacrificial layer 131. As shown in FIG. 5, a second wet etch process is used to remove the first sacrificial layer 131.

Figure 6:
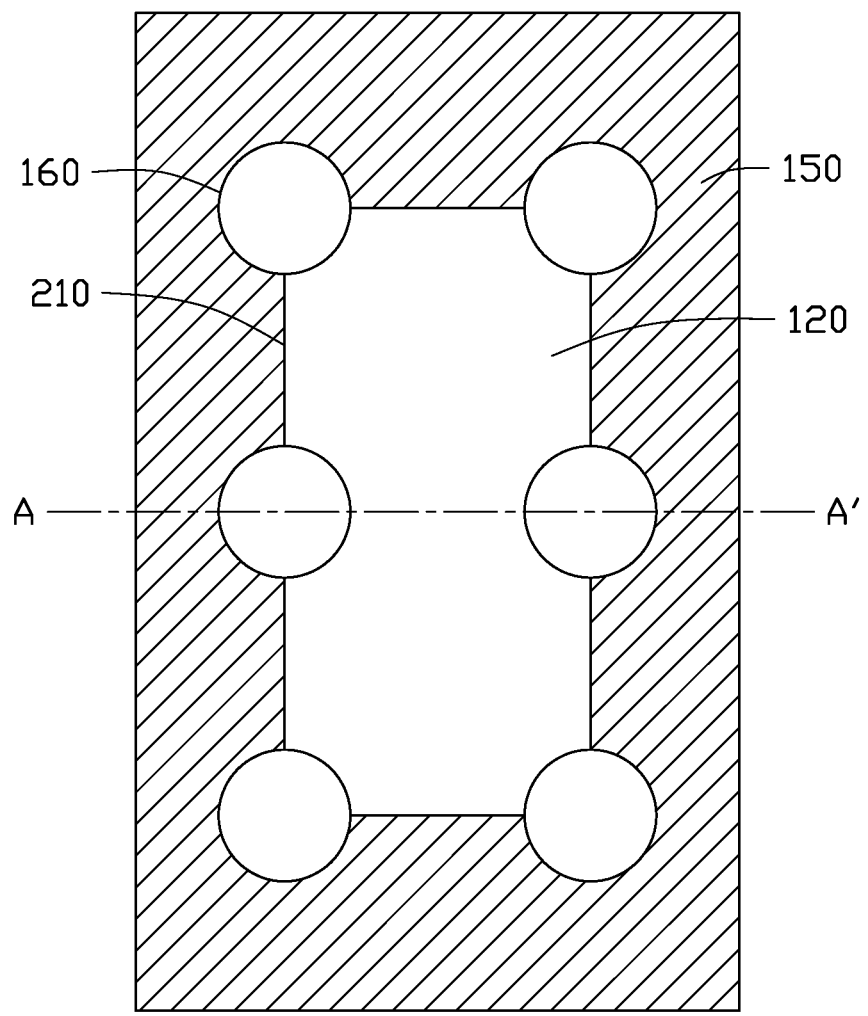
FIG. 6 is a top view of the semiconductor device with reference to FIG. 5, in accordance with some implementations of the present disclosure.

FIG. 6 is a top view of the semiconductor device 100 with reference to FIG. 5 in accordance with some implementations of the present disclosure. A predetermined area of the support layer 150 is chosen to form the recess 210. The shape of the predetermined area may be a rectangle, a circle, or a triangle. FIG. 5 is a cross-sectional view along the dash line A-A'.

Figure 7:
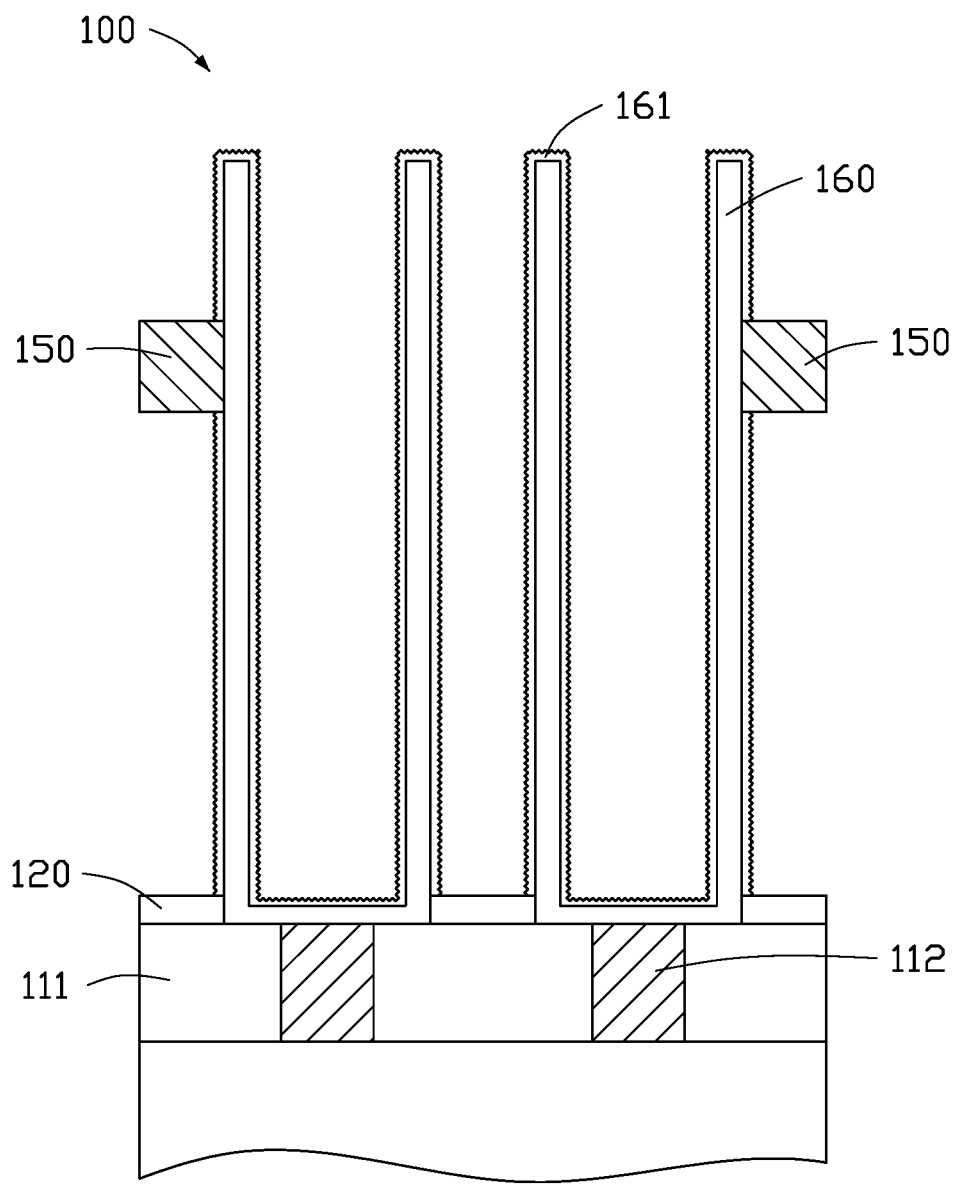
FIG. 7 is a cross-sectional view of a semiconductor device illustrating a state of forming a conductive pattern according to a method for fabricating a capacitor, in accordance with an implementation of the present disclosure.
Figure 8:
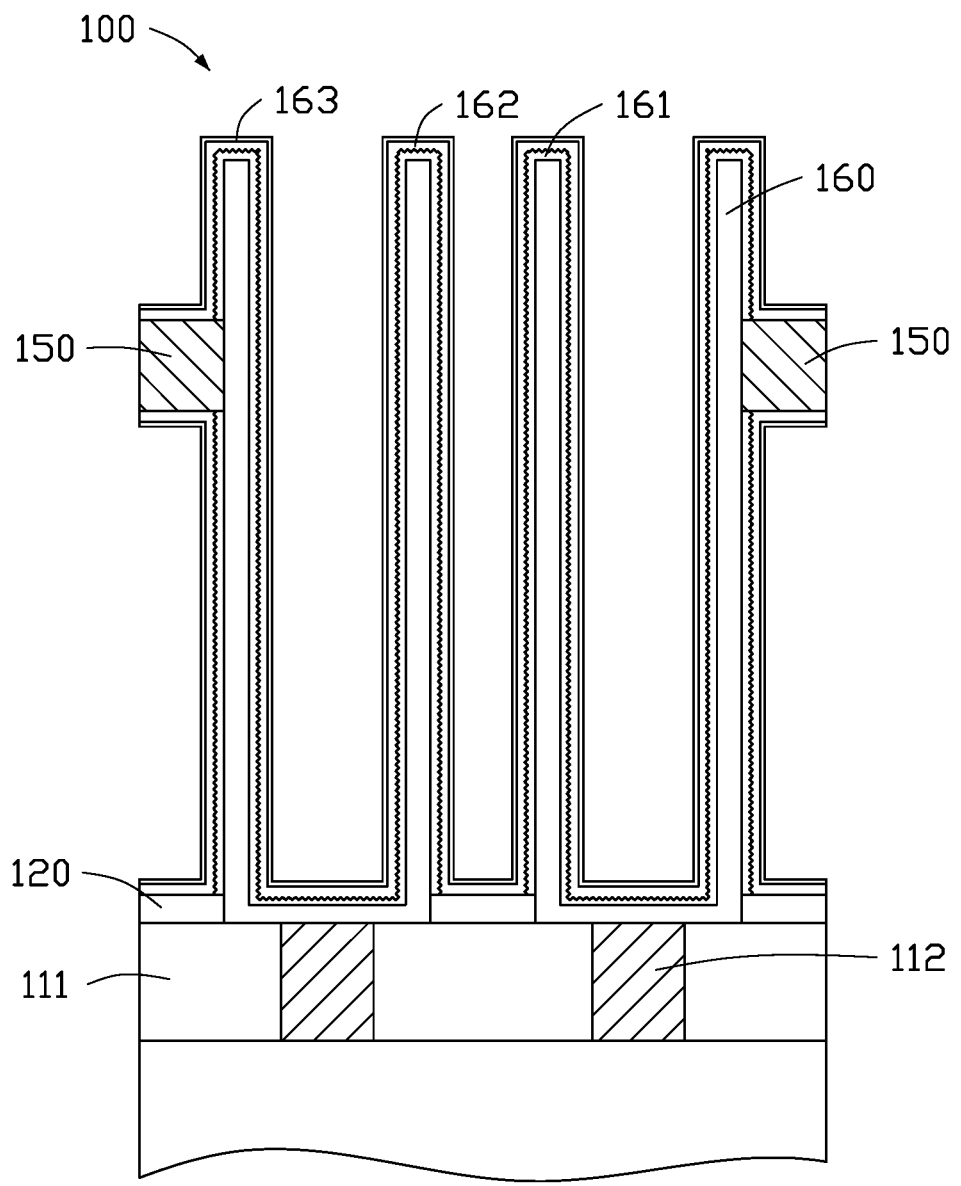
FIG. 8 is a cross-sectional view of the semiconductor device illustrating a state of forming a dielectric layer, in accordance with an implementation of the present disclosure.

FIGS. 7 to 8 are cross-sectional views illustrating a method for fabricating a capacitor having a supporter in the semiconductor device 100 in accordance with some implementations of the present disclosure. As shown in FIG. 7, a first conductive layer 161 is formed to cover the conductive pattern 160 by a deposition process such as atomic layer deposition (ALD), chemical vapor deposition (CVD), or a sequential flow deposition (SFD). For example, the first conductive layer 161 is selectively deposited on an exposed surface of the conductive pattern 160. In some implementations, the conductive pattern 160 has a hollow cylindrical structure extending vertically from the substrate 110. The support layer 150 is formed on a predefined area of an outer sidewall of the hollow cylindrical structure, i.e. the support layer 150 extends horizontally from the outer sidewall. The first conductive layer 161 covers surfaces of the hollow cylindrical structure including the bottom area, the inner sidewall, the top area, and the exposed area of the outer sidewall. In some examples, the first conductive layer 161 may contact with the etch stop layer 120. Preferably, the first conductive layer 161 includes W, WN, tungsten-containing material, or nitrogen-containing material.

As shown in FIG. 8, a dielectric layer 162 is formed to cover the first conductive layer 161, the etch stop layer 120, and the support layer 150. Subsequently, a second conductive layer 163 is formed to cover the dielectric layer 162. Preferably, the dielectric layer 162 includes $Zr_xO_y$, $Hf_xO_y$, $Ta_xO_y$, $ZrHfSiO_x$, $Ti_xO_y$, $La_xO_y$, $Al_xO_y$, $Hf_xSi_yO_z$, or $Zr_xSi_yO_z$. The second conductive layer 163 may be formed of a metal including a material such as TiN, TiSiN, WN, or a compound including a material selected from the group consisting essentially of Ti, W, O, N, and Si.

In some implementations, a thickness of the conductive pattern 160 is 150 angstrom (A) or less, and a thickness of the first conductive layer 161 is 50 A or less. A combination of the conductive pattern 160 and the first conductive layer 161 serves as a lower electrode for a capacitor in DRAM. A root mean square (RMS) of the lower electrode is up to 20 nanometer (nm). A resistivity of the lower electrode is up to 150 microohm centimeter (μΩ·cm).

The terminology used herein is for the purpose of describing particular implementations only and is not intended to be limiting of implementations of the present disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, actions, operations, elements, and/or components, but do not preclude the presence or addition of one or more other features, integers, actions, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to implementations of the present disclosure in the form disclosed. Many modifications and variations will be apparent to those of ordinary skill in the art without departing from the scope and spirit of implementations of the present disclosure. The implementation was chosen and described in order to best explain the principles of implementations of the present disclosure and the practical application, and to enable others of ordinary skill in the art to understand implementations of the present disclosure for various implementations with various modifications as are suited to the particular use contemplated.

Although specific implementations have been illustrated and described herein, those of ordinary skill in the art appreciate that any arrangement which is calculated to achieve the same purpose may be substituted for the specific implementations shown and that implementations of the present disclosure have other applications in other environments. This present disclosure is intended to cover any adaptations or variations of the present disclosure. The following claims are in no way intended to limit the scope of implementations of the present disclosure to the specific implementations described herein.

Various examples have been described. These and other examples are within the scope of the following claims.

What is claimed is:

1. A semiconductor device comprising:
   a substrate;
   a plurality of conductive patterns extending vertically from the substrate;
   a support structure extending horizontally from side walls of the plurality of conductive patterns, wherein a portion of the support structure is removed to form a recess to expose inner sidewalls of the plurality of conductive patterns and a portion of the substrate;
   a first conductive layer covering the plurality of conductive patterns; and
   a dielectric layer at least covering the first conductive layer and the support structure.

2. The semiconductor device of claim 1, wherein the plurality of conductive patterns are electrically connected to a contact region of the substrate.

3. The semiconductor device of claim 1, wherein the plurality of conductive patterns comprise TiN, TiSiN, WN, or a compound comprising a material selected from the group consisting essentially of Ti, W, O, N, and Si.

4. The semiconductor device of claim 1, wherein the first conductive layer comprises W, WN, tungsten-containing material, or nitrogen-containing material.

5. The semiconductor device of claim 1, wherein the dielectric layer comprises $Zr_xO_y$, $Hf_xO_y$, $Ta_xO_y$, $ZrHfSiO_x$-$Ti_xO_y$, $La_xO_y$, $Al_xO_y$, $Hf_xSi_yO_z$, or $Zr_xSi_yO_z$.

6. The semiconductor device of claim 1, further comprising an etch stop layer formed on the substrate, the etch stop layer contacting the plurality of conductive patterns, wherein the dielectric layer further covers the etch stop layer.

7. The semiconductor device of claim 6, wherein the etch stop layer comprises a material selected from silicon nitride (SiN), silicon boron nitride (SiBN), silicon carbon nitride (SiCN), silicon carbide (SiC), silicon oxynitride (SiON), and silicon oxycarbide (SiOC).

8. The semiconductor device of claim 1, further comprising a second conductive layer covering the dielectric layer.

9. The semiconductor device of claim 8, wherein the second conductive layer comprises titanium nitride (TiN), titanium silicide nitride (TiSiN), tungsten nitride (WN), or a compound comprising a material selected from the group consisting essentially of titanium (Ti), tungsten (W), oxygen (O), nitrogen (N), and silicon (Si).

10. The semiconductor device of claim 1, wherein a thickness of the conductive pattern is 150 angstrom (A) or less, and a thickness of the first conductive layer is below 50 or less.

11. The semiconductor device of claim 1, wherein a combination of the plurality of conductive patterns and the first conductive layer serves as a lower electrode for a capacitor in dynamic random access memory (DRAM), and a root mean square (RMS) of the lower electrode is up to 20 nanometer (nm).

12. The semiconductor device of claim 1, wherein each of the plurality of conductive patterns has a hollow cylindrical structure.

* * * * *